United States Patent
Mendenhall

(10) Patent No.: US 10,038,411 B2
(45) Date of Patent: Jul. 31, 2018

(54) METHOD AND APPARATUS FOR DISTORTION REDUCTION IN A CLASS D AMPLIFIER

(71) Applicant: RGB Systems, Inc., Anaheim, CA (US)

(72) Inventor: Eric Mendenhall, Laguna Beach, CA (US)

(73) Assignee: RGB Systems, Inc., Anaheim, CA (US)

(*) Notice: Subject to any disclaimer, the term of this patent is extended or adjusted under 35 U.S.C. 154(b) by 0 days.

(21) Appl. No.: 15/339,387

(22) Filed: Oct. 31, 2016

(65) Prior Publication Data

US 2018/0123527 A1 May 3, 2018

(51) Int. Cl.
| | |
|---|---|
| H03F 1/02 | (2006.01) |
| H03F 1/26 | (2006.01) |
| H03F 3/183 | (2006.01) |
| H03F 3/217 | (2006.01) |
| H03F 3/38 | (2006.01) |
| H03F 1/32 | (2006.01) |

(52) U.S. Cl.
CPC ............ *H03F 1/32* (2013.01); *H03F 1/0205* (2013.01); *H03F 1/26* (2013.01); *H03F 3/183* (2013.01); *H03F 3/217* (2013.01); *H03F 2200/225* (2013.01); *H03F 2201/3215* (2013.01)

(58) Field of Classification Search
USPC ........................................ 330/10, 251, 207 A
See application file for complete search history.

(56) References Cited

U.S. PATENT DOCUMENTS

| | | | |
|---|---|---|---|
| 6,297,692 B1 * | 10/2001 | Nielsen ................ | H03F 1/083 330/10 |
| 7,167,048 B2 | 1/2007 | Mendenhall | |
| 7,253,683 B2 | 8/2007 | Mendenhall | |
| 7,253,684 B2 | 8/2007 | Mendenhall | |

* cited by examiner

*Primary Examiner* — Hieu Nguyen
(74) *Attorney, Agent, or Firm* — Knobbe Martens Olson & Bear LLP

(57) ABSTRACT

A Class D amplifier is described herein that includes an outer loop, an inner loop, and a notch filter. The notch filter can be located between an output of the outer loop and an input of the inner loop. Alternatively or in addition, the notch filter can be located within the outer loop of the Class D amplifier. Ripple content can initially be present at an input to the inner loop of the Class D amplifier, causing nonlinearity in the inner loop and distortion in the audio output signal. The notch filter can filter the ripple content at the input to the inner loop, thereby reducing the nonlinearity present in the inner loop and the distortion in the audio output signal.

15 Claims, 10 Drawing Sheets

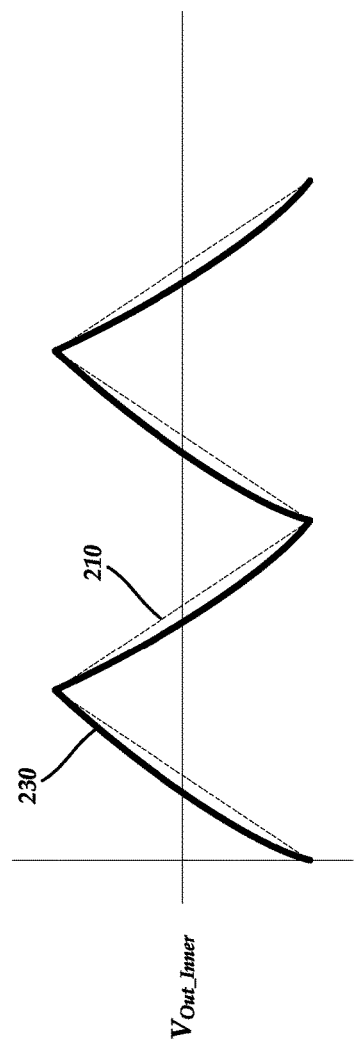

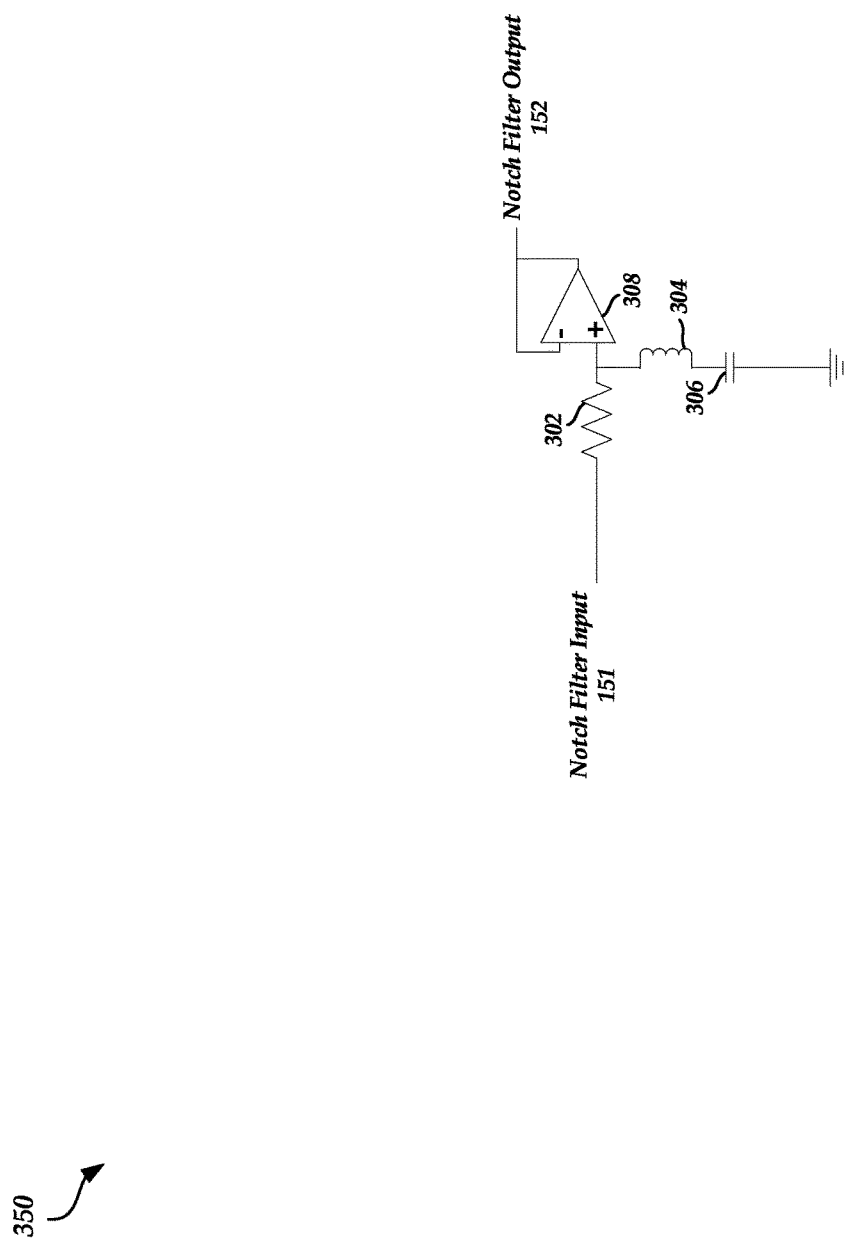

METHOD AND APPARATUS FOR DISTORTION REDUCTION IN A CLASS D AMPLIFIER

TECHNICAL FIELD

The present disclosure relates generally to electronics for reducing distortion in an amplifier.

BACKGROUND

High quality audio power amplifiers are traditionally large, heavy, and inefficient. Typically, these audio power amplifiers are capable of high power audio output with low total harmonic distortion. However, the traditional audio power amplifiers may achieve only approximately 25% efficiency under normal audio operating conditions because such audio power amplifiers generally use inefficient linear or quasi-linear amplifiers (e.g., Class A, B, G, and/or H amplifiers).

Recently, the demand for more efficient audio power amplifiers has increased. Thus, audio power amplifiers have started to include Class D amplifiers. Class D amplifiers allow audio power amplifiers to achieve higher efficiency than traditional audio power amplifiers because switches in the Class D amplifiers are not operated in the linear region. However, a Class D amplifier can introduce ripple content at an input to an inner loop of the Class D amplifier that can increase undesirable signal distortion.

SUMMARY

The systems, methods, and devices described herein each have several aspects, no single one of which is solely responsible for its desirable attributes. Without limiting the scope of this disclosure, several non-limiting features will now be discussed briefly.

As described above, a Class D amplifier can introduce ripple content at an input to an inner loop of the Class D amplifier that can increase undesirable signal distortion. Accordingly, an example Class D amplifier is described herein that includes an outer loop, an inner loop, and a notch filter. The notch filter can be located between an output of the outer loop and an input of the inner loop. Alternatively or in addition, the notch filter can be located within the outer loop of the Class D amplifier. Ripple content can initially be present at an input to the inner loop of the Class D amplifier, causing nonlinearity in the inner loop and distortion in the audio output signal. While the outer loop's primary function is to reduce the impact of an LC filter in the Class D amplifier on the output voltage, the outer loop may also attenuate ripple content at the input to the inner loop, thereby reducing distortion. The notch filter can then further filter the attenuated ripple content at the input of the inner loop, thereby reducing the nonlinearity present in the inner loop and the distortion in the audio output signal.

One aspect of the disclosure provides an apparatus comprising: an output; an inner circuit loop that has an input and an output; a filter circuit that has an input and an output, where the input of the filter circuit is coupled to the output of the inner circuit loop, and where the output of the filter circuit is coupled to the output of the apparatus; an outer circuit loop that has an input and output, where the input of the outer circuit loop is coupled to the output of the filter circuit and the output of the apparatus; and a notch filter that has an input and an output, where the input of the notch filter is coupled to the output of the outer circuit loop, where the output of the notch filter is coupled to the input of the inner circuit loop, and where the notch filter is configured to reduce a portion of a ripple content originating at the output of the apparatus that is present at the input of the inner circuit loop from a first level to a second level lower than the first level.

The apparatus of the preceding paragraph can include any sub-combination of the following features: where the notch filter comprises a noninverting active series LC notch filter; where the notch filter comprises a noninverting active series LC notch filter comprising a resistor, an inductor, a capacitor, and a comparator, where a first end of the resistor is coupled to the output of the outer circuit loop, where a first end of the inductor is coupled in series with a first end of the capacitor, where a second end of the capacitor is coupled to ground, where a second end of the resistor and a second end of the inductor are coupled to a positive input of the comparator, and where an output of the comparator is coupled to a negative input of the comparator and the input of the inner circuit loop; where the notch filter comprises an inverting active series LC notch filter; where the notch filter is configured to reduce the ripple content by 2% to 20%; where the notch filter comprises an inverting active series LC notch filter comprising a first resistor, a second resistor, a third resistor, a fourth resistor, a fifth resistor, an inductor, a capacitor, a first comparator, and a second comparator, where a first end of the first resistor is coupled to the output of the outer circuit loop, where a second end of the first resistor is coupled to a first end of the second resistor and a first end of the inductor, where a second end of the inductor is coupled to a first end of the capacitor, where a second end of the capacitor is coupled to ground, where a second end of the second resistor is coupled to a negative input of the first comparator and a first end of the third resistor, where a positive input of the first comparator is coupled to ground, where an output of the comparator is coupled to a second end of the third resistor and a first end of the fourth resistor, where a second end of the fourth resistor is coupled to a negative input of the second comparator and a first end of the fifth resistor, where a positive input of the second comparator is coupled to ground, and where an output of the second comparator is coupled to a second end of the fifth resistor and the input of the inner circuit loop; where the notch filter comprises a noninverting active parallel LC notch filter; where the notch filter comprises a noninverting active parallel LC notch filter comprising a resistor, an inductor, a capacitor, and a comparator, where a first end of the inductor and a first end of the capacitor are coupled to the output of the outer circuit loop, where a second end of the inductor and a second end of the capacitor are coupled to a first end of the resistor and a positive input of the comparator, where a second end of the resistor is coupled to ground, and where an output of the comparator is coupled to a negative input of the comparator and the input of the inner circuit loop; where the notch filter comprises an inverting active parallel LC notch filter; where the notch filter comprises an inverting active parallel LC notch filter comprising a first resistor, a second resistor, a third resistor, and a fourth resistor, an inductor, a capacitor, a first comparator, and a second comparator, where a first end of the inductor and a first end of the capacitor are coupled to the output of the outer circuit loop, where a second end of the inductor and a second end of the capacitor are coupled to a first end of the first resistor, where a second end of the first resistor is coupled to a negative input of the first comparator and a first end of the second resistor, where a positive input of the first comparator is coupled to ground, where an output of the comparator is coupled to a second end of the second resistor and a first end of the third resistor, where a second end of the third resistor is coupled to a negative input of the second comparator and a first end of the fourth resistor, where a positive input of the second comparator is coupled to ground, and where an output of the second comparator is coupled to a second end of the fourth resistor and the input of the inner circuit loop; where the notch filter comprises a noninverting active twin tee filter; where the notch filter comprises a noninverting active twin tee filter comprising a first resistor, a second resistor, a third resistor, a fourth resistor, and a fifth resistor, a first capacitor, a second capacitor, a third capacitor, a first comparator, and a second comparator, where a first end of the first resistor and a first end of the first capacitor are coupled to the output of the outer circuit loop, where a second end of the first capacitor is coupled to a first end of the third resistor and a first end of the second capacitor, where a second end of the first resistor is coupled to a first end of the second resistor and a first end of the third capacitor, where a second end of the third resistor and a second end of the third capacitor are coupled to an output of the second comparator, where a second end of the second resistor and a second end of the second capacitor are coupled to a positive input of the first comparator, where an output of the first comparator is coupled to a negative input of the first comparator, the input of the inner circuit loop, and a first end of the fourth resistor, where a second end of the fourth resistor is coupled to a first end of the fifth resistor and a positive input of the second comparator, where a second end of the fifth resistor is coupled to ground, and where the output of the second comparator is coupled to a negative input of the second comparator; and where the apparatus comprises a Class D amplifier.

Another aspect of the disclosure provides a method comprising: generating an output signal at an output of a filter circuit and at an input of an outer circuit loop, where the output of the filter circuit is coupled to the input of the outer circuit loop, and where the output signal comprises a ripple content; transmitting the output signal through the outer circuit loop; filtering, via a notch filter, the ripple content present in the output signal at an output of the outer circuit loop; and receiving the output signal with the filtered ripple content at an input of an inner circuit loop, where an output of the inner circuit loop is coupled to an input of the filter circuit.

The method of the preceding paragraph can include any sub-combination of the following features: where filtering, via the notch filter, the ripple content present in the output signal, further comprises reducing the ripple content by 2% to 20%; where the notch filter comprises one of a noninverting active series LC notch filter, an inverting active series LC notch filter, a noninverting active parallel LC notch filter, an inverting active parallel LC notch filter, or a noninverting active twin tee filter; where the noninverting active series LC notch filter comprises a resistor, an inductor, a capacitor, and a comparator, where a first end of the resistor is coupled to the output of the outer circuit loop, where a first end of the inductor is coupled in series with a first end of the capacitor, where a second end of the capacitor is coupled to ground, where a second end of the resistor and a second end of the inductor are coupled to a positive input of the comparator, and where an output of the comparator is coupled to a negative input of the comparator and the input of the inner circuit loop; where the inverting active series LC notch filter comprises a first resistor, a second resistor, a third resistor, a fourth resistor, a fifth resistor, an inductor, a capacitor, a first comparator, and a second comparator, where a first end of the first resistor is coupled to the output of the outer circuit loop, where a second end of the first resistor is coupled to a first end of the second resistor and a first end of the inductor, where a second end of the inductor is coupled to a first end of the capacitor, where a second end of the capacitor is coupled to ground, where a second end of the second resistor is coupled to a negative input of the first comparator and a first end of the third resistor, where a positive input of the first comparator is coupled to ground, where an output of the comparator is coupled to a second end of the third resistor and a first end of the fourth resistor, where a second end of the fourth resistor is coupled to a negative input of the second comparator and a first end of the fifth resistor, where a positive input of the second comparator is coupled to ground, and where an output of the second comparator is coupled to a second end of the fifth resistor and the input of the inner circuit loop; where the noninverting active parallel LC notch filter comprises a resistor, an inductor, a capacitor, and a comparator, where a first end of the inductor and a first end of the capacitor are coupled to the output of the outer circuit loop, where a second end of the inductor and a second end of the capacitor are coupled to a first end of the resistor and a positive input of the comparator, where a second end of the resistor is coupled to ground, and where an output of the comparator is coupled to a negative input of the comparator and the input of the inner circuit loop; where the inverting active parallel LC notch filter comprises a first resistor, a second resistor, a third resistor, and a fourth resistor, an inductor, a capacitor, a first comparator, and a second comparator, where a first end of the inductor and a first end of the capacitor are coupled to the output of the outer circuit loop, where a second end of the inductor and a second end of the capacitor are coupled to a first end of the first resistor, where a second end of the first resistor is coupled to a negative input of the first comparator and a first end of the second resistor, where a positive input of the first comparator is coupled to ground, where an output of the comparator is coupled to a second end of the second resistor and a first end of the third resistor, where a second end of the third resistor is coupled to a negative input of the second comparator and a first end of the fourth resistor, where a positive input of the second comparator is coupled to ground, and where an output of the second comparator is coupled to a second end of the fourth resistor and the input of the inner circuit loop; where the noninverting active twin tee filter comprises a first resistor, a second resistor, a third resistor, a fourth resistor, and a fifth resistor, a first capacitor, a second capacitor, a third capacitor, a first comparator, and a second comparator, where a first end of the first resistor and a first end of the first capacitor are coupled to the output of the outer circuit loop, where a second end of the first capacitor is coupled to a first end of the third resistor and a first end of the second capacitor, where a second end of the first resistor is coupled to a first end of the second resistor and a first end of the third capacitor, where a second end of the third resistor and a second end of the third capacitor are coupled to an output of the second comparator, where a second end of the second resistor and a second end of the second capacitor are coupled to a positive input of the first comparator, where an output of the first comparator is coupled to a negative input of the first comparator, the input of the inner circuit loop, and a first end of the fourth resistor, where a second end of the fourth resistor is coupled to a first end of the fifth resistor and a positive input of the second comparator, where a second end of the fifth resistor is coupled to ground, and where the output of the second comparator is coupled to a negative input of the second comparator; and where the output voltage comprises an output voltage of a Class D amplifier.

BRIEF DESCRIPTION OF THE DRAWINGS

Embodiments will now be described with reference to the drawings summarized below. These drawings and the associated description are provided to illustrate example aspects of the disclosure, and not to limit the scope of the invention.

FIG. 2C illustrates an example waveform of $V_{Out\_Inner}$ of a Class D amplifier when the input of the inner loop of the Class D amplifier includes the ripple content.

FIG. 3 illustrates an example topology of a noninverting active series LC notch filter for use in the Class D amplifier of FIG. 1.

DETAILED DESCRIPTION OF SPECIFIC EMBODIMENTS

As described above, a Class D amplifier can increase audio power amplifier efficiency, but may cause signal distortion. For example, a Class D amplifier may have an inner loop and an outer loop. Ripple content present at the input to the inner loop can result in a distortion of the audio output signal. In some cases, the Class D amplifier can be designed such that the Class D amplifier exhibits a high crossover frequency in order to reduce audio output signal distortion. A high crossover frequency may result in a higher outer loop gain, which can increase the ripple content at the input to the inner loop. However, the reduction in audio output signal distortion due to the high cross frequency characteristic of the Class D amplifier generally outweighs any increase in the distortion caused by the increase in ripple content at the input to the inner loop.

High voltage Class D amplifiers, however, may not benefit from such a tradeoff. Rather, the increase in distortion caused by the increase in ripple content may outweigh any decrease in distortion caused by the high crossover frequency characteristic in such amplifiers. Thus, it may be beneficial to design a Class D amplifier such that the ripple content at the input of the inner loop can be reduced without a corresponding reduction in the crossover frequency.

Accordingly, described herein is a Class D amplifier that includes an inner loop, an outer loop, and a notch filter. As described in greater detail below, the notch filter can reduce, attenuate, or cancel the ripple content present at the input of the inner loop.

Figure 1:
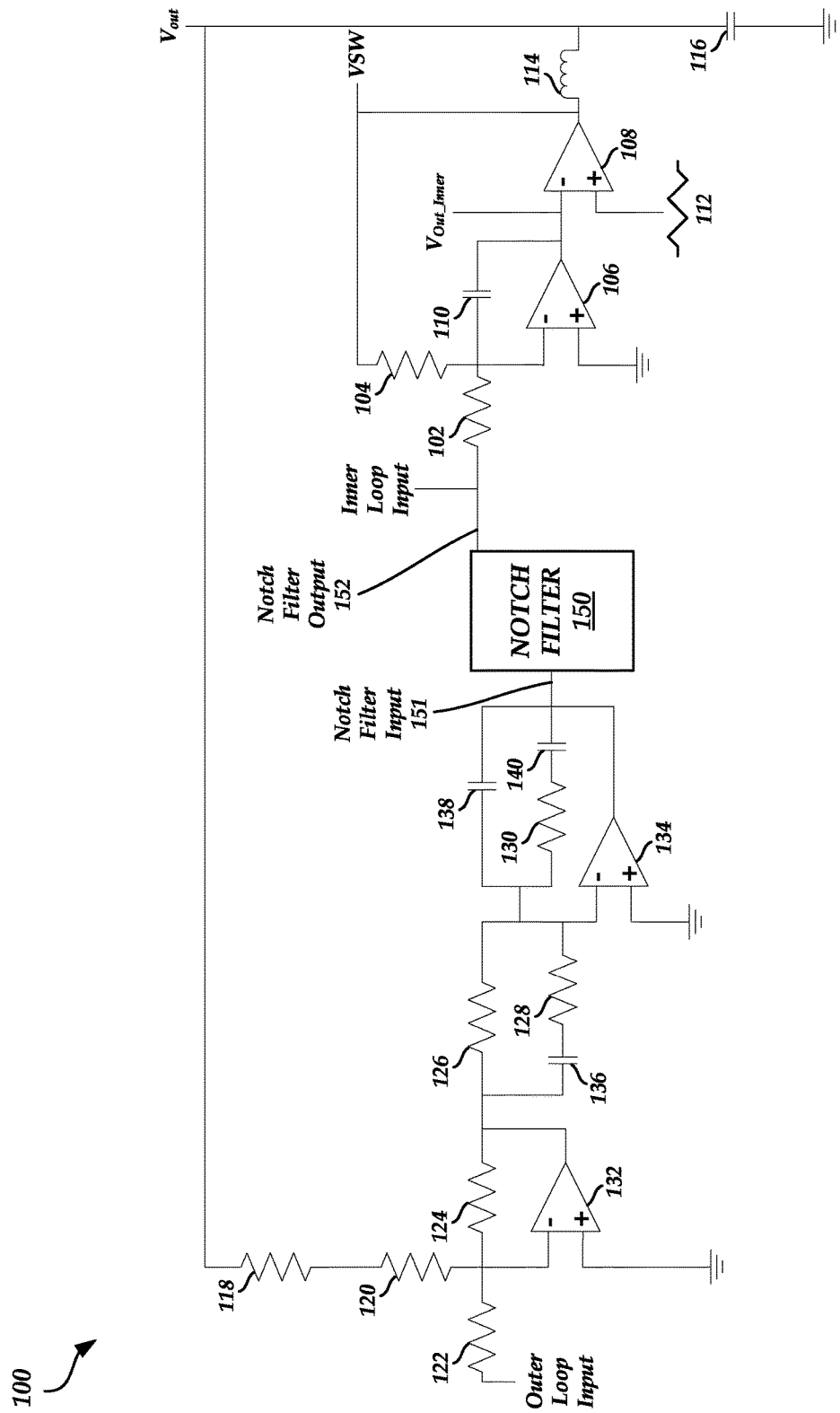
FIG. 1 illustrates an example topology of a Class D amplifier with a notch filter.

FIG. 1 illustrates an example topology of a Class D amplifier 100 with a notch filter 150. As illustrated in FIG. 1, the example Class D amplifier 100 includes an inner loop that includes resistors 102 and 104, comparators 106 and 108, and capacitor 110. The comparator 108 receives, as an input, a triangle waveform 112 and a voltage $V_{Out\_Inner}$ (e.g., the output voltage of the inner loop) and outputs a voltage VSW (e.g., the switch node voltage). The voltage VSW is fed back to the resistor 104 without passing through an output filter that includes inductor 114 and capacitor 116.

The Class D amplifier 100 also includes an outer loop that includes resistors 118, 120, 122, 124, 126, 128, and 130, comparators 132 and 134, and capacitors 136, 138, and 140. The output filter filters the voltage VSW and filtered voltage VSW (e.g., $V_{Out}$ of the Class D amplifier 100) is fed back to the resistor 118 of the outer loop.

Figure 2A:
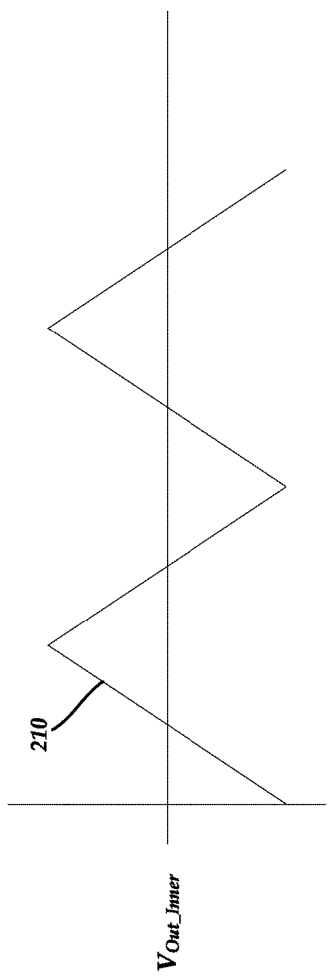
FIG. 2A illustrates an example waveform of $V_{Out\_Inner}$ of a Class D amplifier when the input of the inner loop of the Class D amplifier is a DC signal or a signal with an otherwise low frequency

In conventional Class D amplifiers, the output of the outer loop (e.g., node notch filter input 151) is directly coupled to the input of the inner loop (e.g., node notch filter output 152 or node inner loop input). In such a topology, if the output of the outer loop (e.g., the input of the inner loop) has a frequency well below the switching frequency (e.g., a DC signal or a signal with an otherwise low frequency), then the inner loop provides excellent linearity. For example, FIG. 2A illustrates a waveform 210 of $V_{Out\_Inner}$ when the input of the inner loop is a DC signal or a signal with an otherwise low frequency. As illustrated in FIG. 2A, the waveform 210 is a perfect or nearly perfect triangle waveform. Such a waveform results in a linear transfer function in the comparator 106.

Figure 2B:
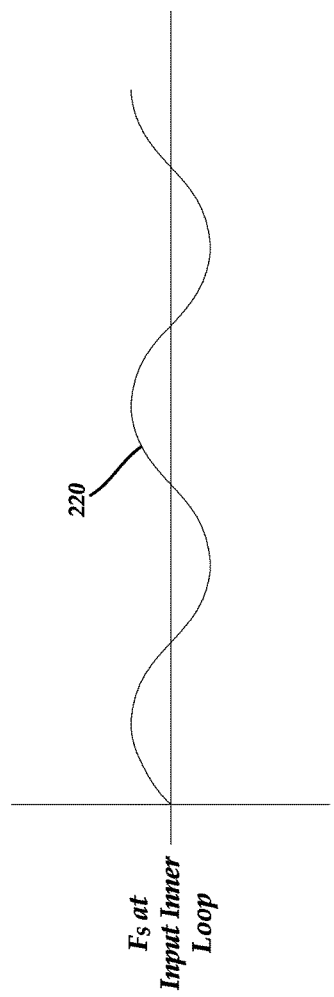
FIG. 2B illustrates an example waveform representing the ripple content introduced at the input of the inner loop of a Class D amplifier.

However, $V_{out}$ exhibits a ripple voltage at the switching frequency in the form of a quasi-sine wave. This ripple voltage may pass through the outer loop to arrive at the input of the inner loop and be significant enough to cause the issues described above. FIG. 2B illustrates an example waveform 220 representing the ripple content introduced at the input of the inner loop. Introducing this ripple content at the input of the inner loop can cause the $V_{Out\_Inner}$ signal to no longer exhibit a perfect or nearly perfect triangle waveform, causing nonlinearities in the comparator 106 and a distortion in $V_{Out}$.

FIG. 2C illustrates an example waveform 230 of $V_{Out\_Inner}$ when the input of the inner loop includes the ripple content. As illustrated in FIG. 2C, the waveform 230 includes nonlinearities, such as curves or bends in the signal, unlike the perfect or nearly perfect triangle waveform 210.

To reduce the above-identified nonlinearities, the notch filter 150 can be introduced between the output of the outer loop (e.g., the node notch filter input 151) and the input of the inner loop (e.g., the node notch filter output 152). Optionally, the notch filter 150 is a high Q notch filter. The notch filter 150 is configured to reduce the ripple content present at the input of the inner loop. For example, the notch filter 150 may reduce the ripple content by about 2% to 20%, although the notch filter 150 may be configured to reduce the ripple content by different percentages. Such a reduction in the ripple content may correspond to a 0.05% to 0.08% reduction in total harmonic distortion present in the output signal at $V_{Out}$, although the total harmonic distortion may be reduced by different percentages. FIGS. 3-7 illustrate various examples of the notch filter 150, as described in greater detail below.

FIG. 3 illustrates an example topology of a noninverting active series LC notch filter 350 for use in the example Class D amplifier 100 of FIG. 1. For example, the notch filter 350 can be inserted in place of the notch filter 150 of the Class D amplifier 100 to reduce the nonlinearities caused by the ripple content (e.g., the input of the notch filter 350 can be coupled to the node notch filter input 151 and the output of the notch filter 350 can be coupled to the node notch filter output 152). As illustrated in FIG. 3, the example notch filter 350 includes a resistor 302, an inductor 304, a capacitor 306, and a comparator 308.

In the illustrated optional topology, a first end of the capacitor 306 is coupled in series with the inductor 304 and a second end of the capacitor 306 is coupled to ground. The inductor 304 and the capacitor 306 together can further be coupled in parallel with the resistor 302, where the resistor 302 and the inductor 304 share a node at a positive input of the comparator 308. The opposite end of the resistor 302 can be coupled to the node notch filter input 151. The output of the comparator 308 can be coupled to a negative input of the comparator 308 via a feedback loop. The output of the comparator 308 can also be coupled to the node notch filter output 152.

Figure 4:
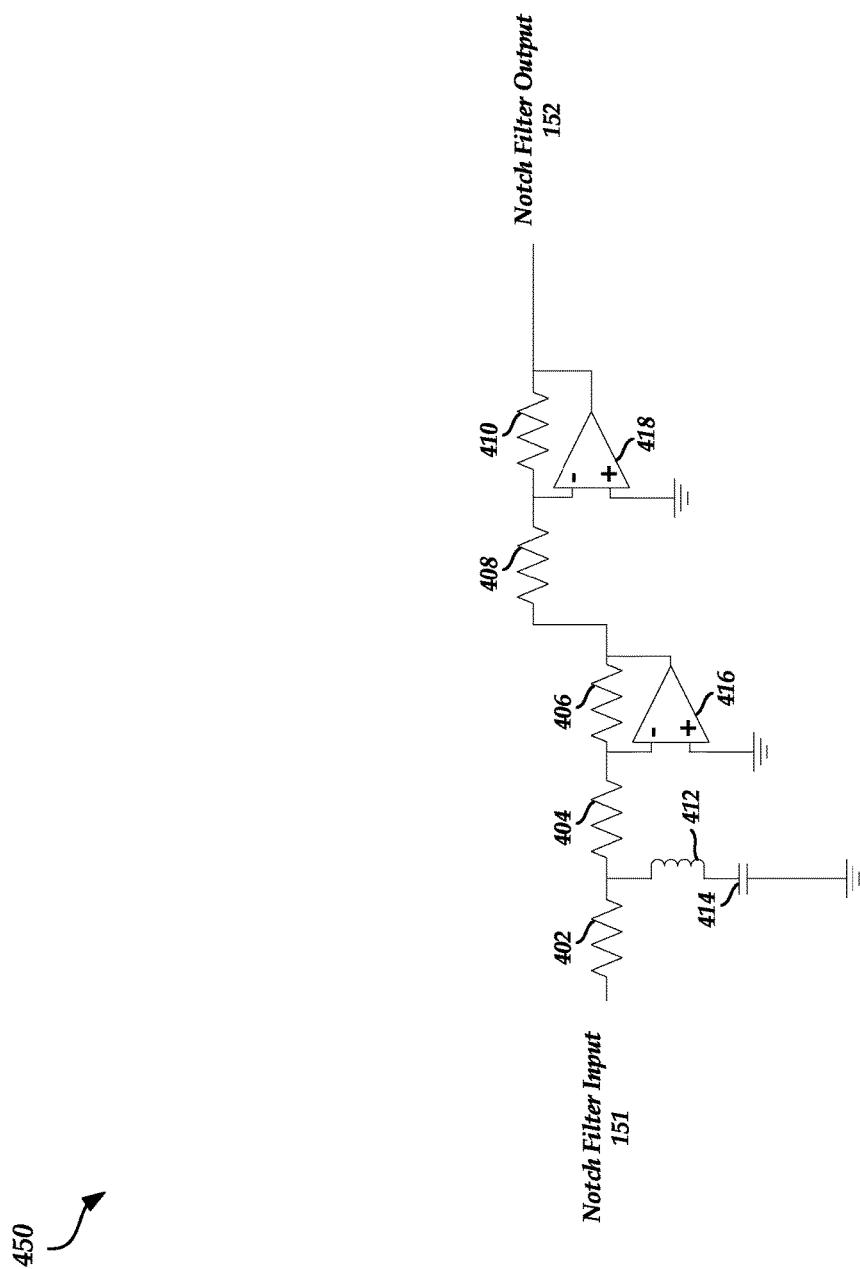
FIG. 4 illustrates a topology of an inverting active series LC notch filter for use in the Class D amplifier of FIG. 1.

FIG. 4 illustrates an example topology of an inverting active series LC notch filter 450 for use in the Class D amplifier 100 of FIG. 1. For example, the notch filter 450 can be inserted in place of the notch filter 150 of the Class D amplifier 100 to reduce the nonlinearities caused by the ripple content (e.g., the input of the notch filter 450 can be coupled to the node notch filter input 151 and the output of the notch filter 450 can be coupled to the node notch filter output 152). As illustrated in FIG. 4, the notch filter 450 includes resistors 402, 404, 406, 408, and 410, an inductor 412, a capacitor 414, and comparators 416 and 418.

In the illustrated optional topology, a first end of the capacitor 414 is coupled in series with the inductor 412 and a second end of the capacitor 414 is coupled to ground. The inductor 412 and the capacitor 414 together can further be coupled in parallel with the resistor 402, where the resistor 402 and the inductor 412 share a node at one end of the resistor 404. The opposite end of the resistor 402 can be coupled to the node notch filter input 151. The parallel combination of the resistor 402 and the inductor 412 and the capacitor 414 can be coupled in series with the resistor 404.

The other end of the resistor 404 can be coupled to a node shared by one end of the resistor 406 and a negative input of the comparator 416. The output of the comparator 416 can be coupled to the negative input of the comparator 416 via a feedback loop that includes the resistor 406 in series with the negative input and the output of the comparator 416. The output of the comparator 416 can also be coupled with the resistor 408. A positive input of the comparator 416 can be coupled to ground.

The combination of the resistors 402, 404, and 406, the inductor 412, the capacitor 414, and the comparator 416 can be coupled in series with the resistor 408. The other end of the resistor 408 can be coupled to a node shared by one end of the resistor 410 and a negative input of the comparator 418. The output of the comparator 418 can be coupled to the negative input of the comparator 418 via a feedback loop that includes the resistor 410 in series with the negative input and the output of the comparator 418. The output of the comparator 418 can also be coupled to the node notch filter output 152.

Figure 5:
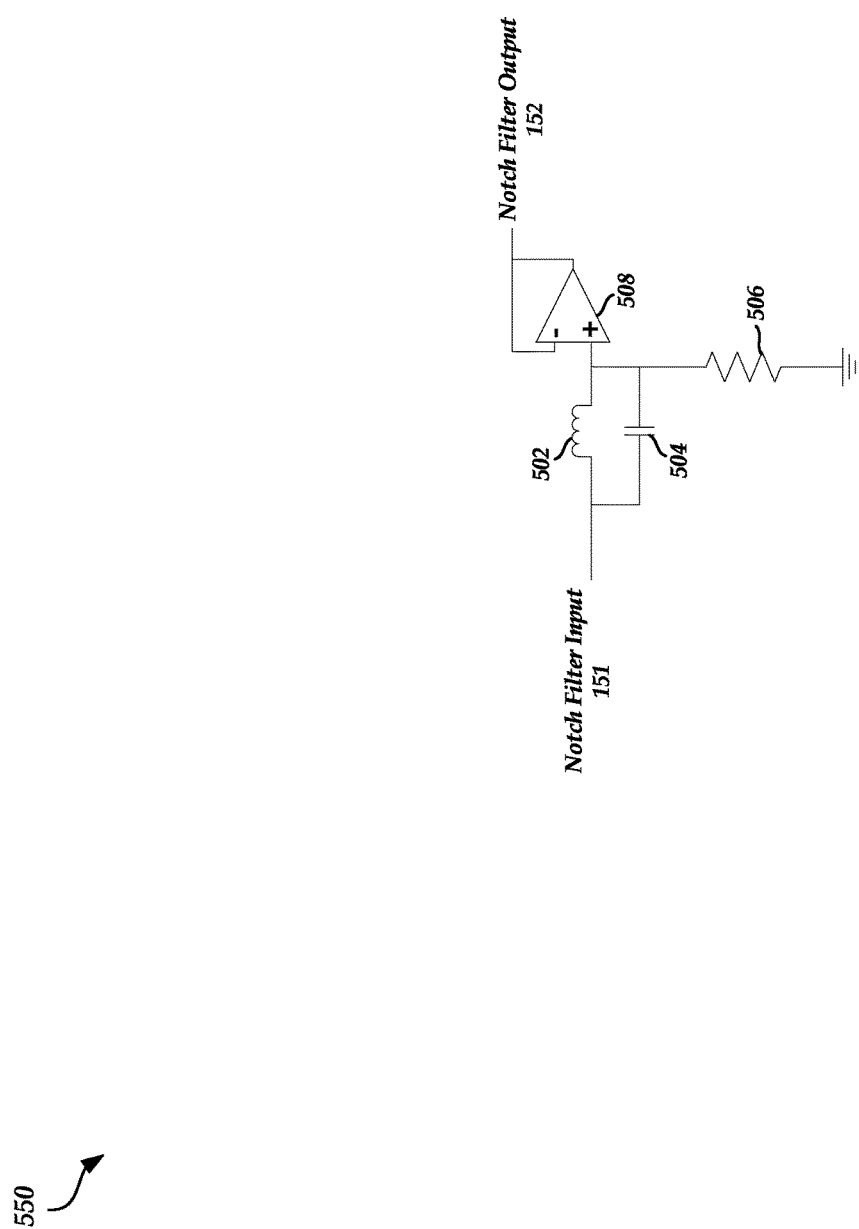
FIG. 5 illustrates an example topology of a noninverting active parallel LC notch filter for use in the Class D amplifier of FIG. 1.

FIG. 5 illustrates an example topology of a noninverting active parallel LC notch filter 550 for use in the Class D amplifier 100 of FIG. 1. For example, the notch filter 550 can be inserted in place of the notch filter 150 of the Class D amplifier 100 to reduce the nonlinearities caused by the ripple content (e.g., the input of the notch filter 550 can be coupled to the node notch filter input 151 and the output of the notch filter 550 can be coupled to the node notch filter output 152). As illustrated in FIG. 5, the notch filter 550 includes an inductor 502, a capacitor 504, a resistor 506, and a comparator 508.

In the illustrated optional topology, the inductor 502 and the capacitor 504 are coupled in parallel. One end of the parallel combination of the inductor 502 and the capacitor 504 can be coupled to the node notch filter input 151. The other end of the parallel combination of the inductor 502 and the capacitor 504 shares a node with a positive input of the comparator 508 and one end of the resistor 506. The other end of the resistor 506 can be coupled to ground. The output of the comparator 508 can be coupled to a negative input of the comparator 508 via a feedback loop. The output of the comparator 508 can also be coupled to the node notch filter output 152.

Figure 6:
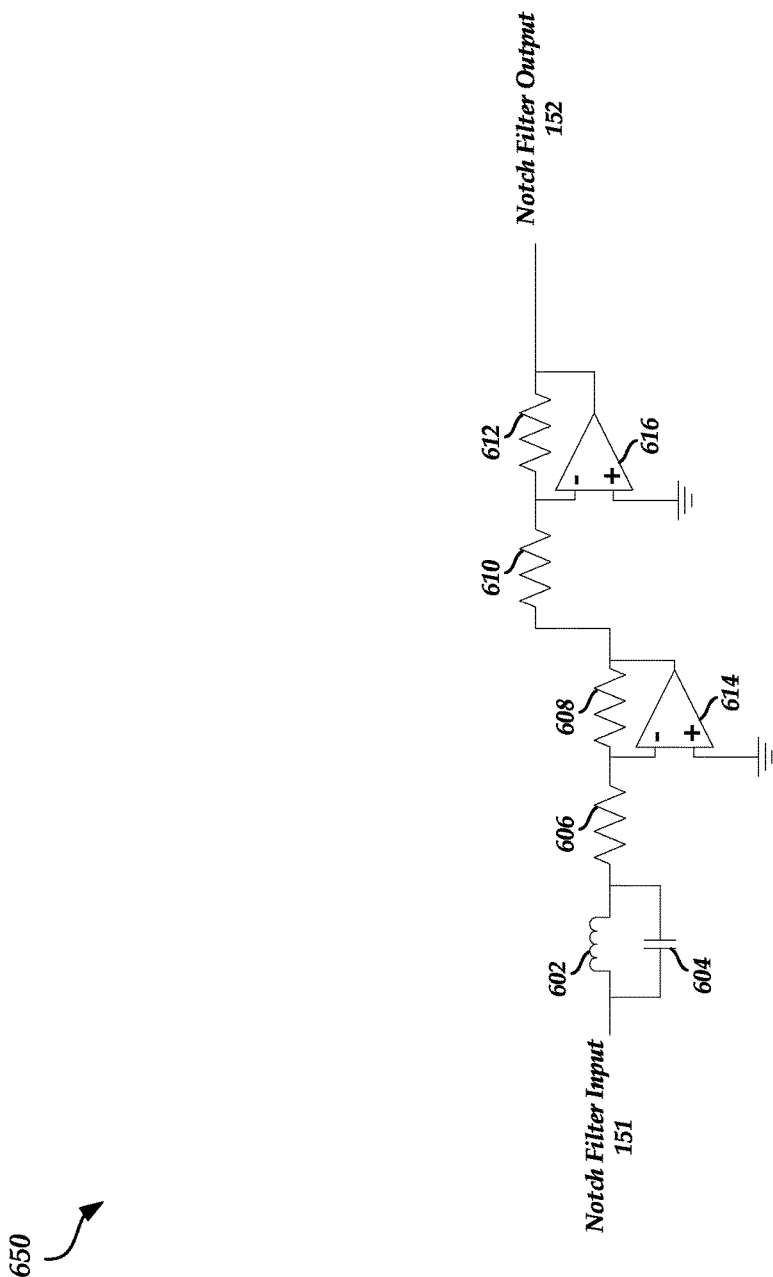
FIG. 6 illustrates an example topology of an inverting active parallel LC notch filter for use in the Class D amplifier of FIG. 1.

FIG. 6 illustrates an example topology of an inverting active parallel LC notch filter 650 for use in the Class D amplifier 100 of FIG. 1. For example, the notch filter 650 can be inserted in place of the notch filter 150 of the Class D amplifier 100 to reduce the nonlinearities caused by the ripple content (e.g., the input of the notch filter 650 can be coupled to the node notch filter input 151 and the output of the notch filter 650 can be coupled to the node notch filter output 152). As illustrated in FIG. 6, the notch filter 650 includes an inductor 602, a capacitor 604, resistors 606, 608, 610, and 612, and comparators 614 and 616.

In the illustrated optional topology, the inductor 602 and the capacitor 604 are coupled in parallel. One end of the parallel combination of the inductor 602 and the capacitor 604 can be coupled to the node notch filter input 151. The other end of the parallel combination of the inductor 602 and the capacitor 604 is coupled to one end of the resistor 606. The other end of the resistor 606 can be coupled to a node shared with one end of the resistor 608 and a negative input of the comparator 614. The output of the comparator 614 can be coupled to the negative input of the comparator 614 via a feedback loop that includes the resistor 608 in series with the negative input and the output of the comparator 614. The output of the comparator 614 can also be coupled with the resistor 610. A positive input of the comparator 614 can be coupled to ground.

The combination of the inductor 602, the capacitor 604, the resistors 606 and 608, and the comparator 614 can be coupled in series with one end of the resistor 610. The other end of the resistor 610 can be coupled to a node shared with one end of the resistor 612 and a negative input of the comparator 616. The output of the comparator 616 can be coupled to the negative input of the comparator 616 via a feedback loop that includes the resistor 612 in series with the negative input and the output of the comparator 616. A positive input of the comparator 616 can be coupled to ground. The output of the comparator 616 can also be coupled to the node notch filter output 152.

Figure 7:
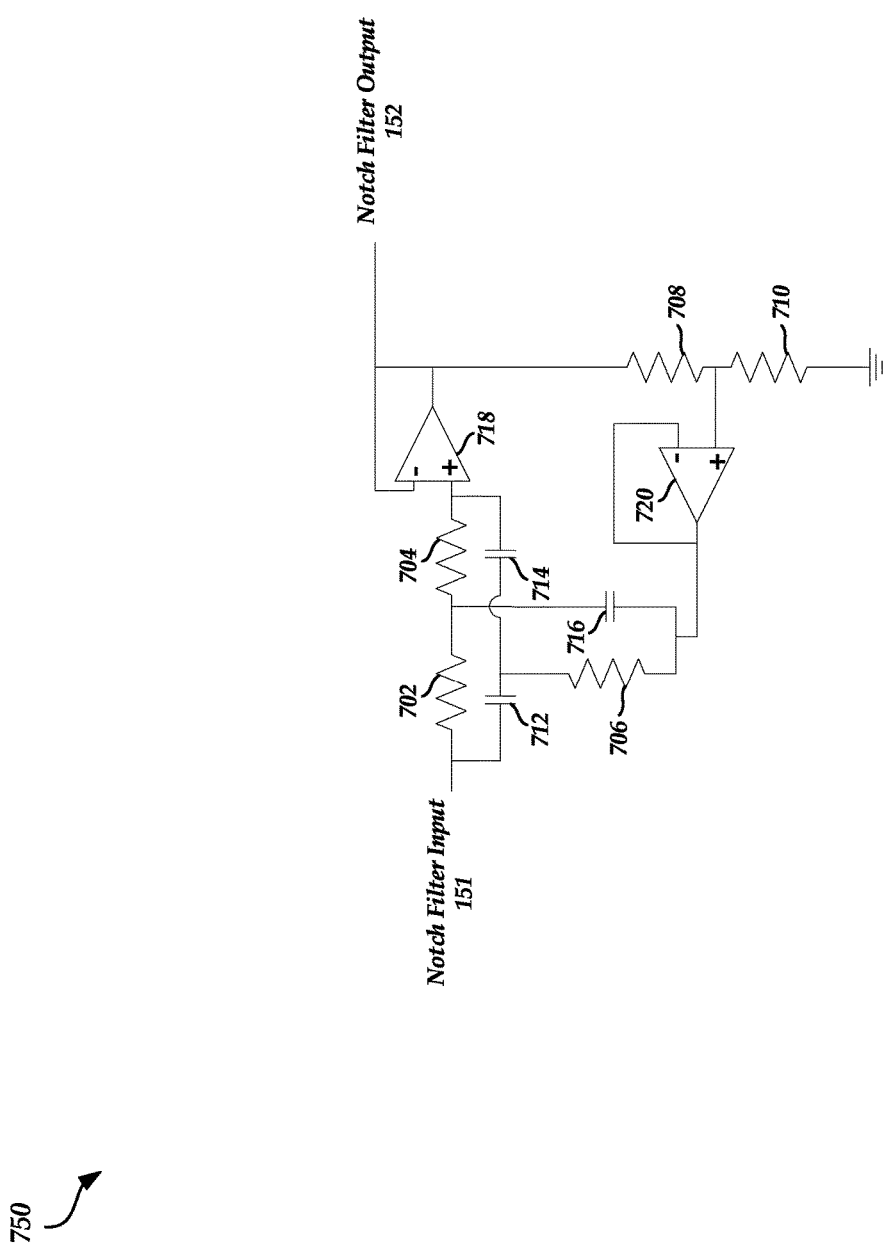
FIG. 7 illustrates an example topology of a noninverting active twin tee filter for use in the Class D amplifier of FIG. 1.

FIG. 7 illustrates an example topology of a noninverting active twin tee filter 750 for use in the Class D amplifier 100 of FIG. 1. For example, the twin tee filter 750 can be inserted in place of the notch filter 150 of the Class D amplifier 100 to reduce the nonlinearities caused by the ripple content (e.g., the input of the twin tee filter 750 can be coupled to the node notch filter input 151 and the output of the twin tee filter 750 can be coupled to the node notch filter output 152). As illustrated in FIG. 7, the twin tee filter 750 includes resistors 702, 704, 706, 708, and 710, capacitors 712, 714, and 716, and comparators 718 and 720.

In the illustrated optional topology, one end of the capacitor 712 shares a node with the node notch filter input 151 and one end of the resistor 702. The other end of the capacitor 712 shares a node with one end of the resistor 706 and one end of the capacitor 714. The other end of the resistor 702 can share a node with one end of the capacitor 716 and one end of the resistor 704. The other ends of the resistor 704 and the capacitor 714 can share a node at a positive input of the comparator 718. The output of the comparator 718 can be coupled to a negative input of the comparator 718 via a feedback loop. The output of the comparator 718 can also be coupled to the node notch filter output 152.

The other ends of the resistor 706 and the capacitor 716 can share a node at an output of the comparator 720. The output of the comparator 720 can be coupled to a negative input of the comparator 720 via a feedback loop. One end of the resistor 710 is coupled to ground and the other end of the resistor 710 can share a node with a positive input of the comparator 720 and one end of the resistor 708. The other end of the resistor 708 can be coupled to the negative input and output of the comparator 718 and the node notch filter output 152.

Figure 8:
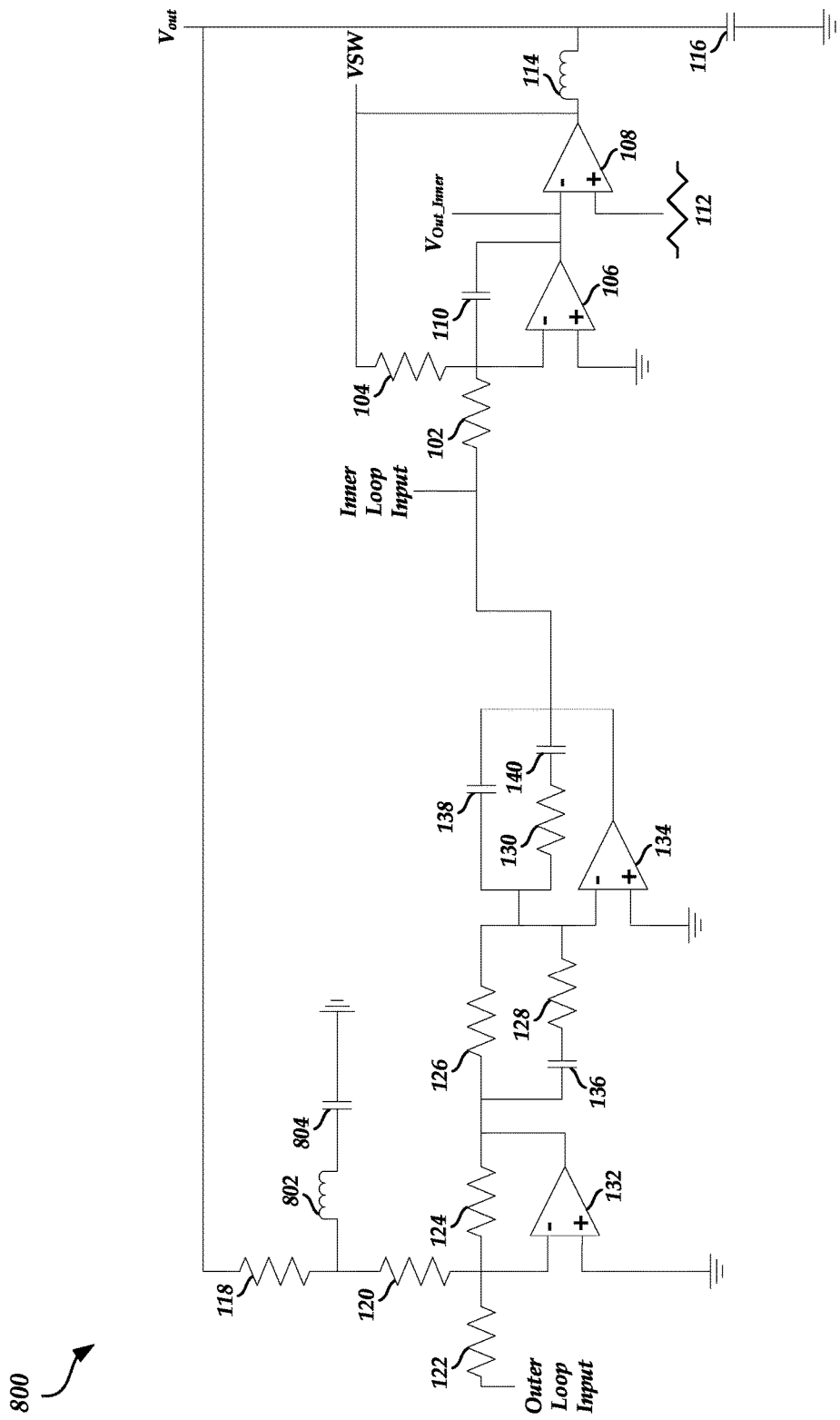
FIG. 8 illustrates an example topology of a Class D amplifier with a series LC shunting outer loop feedback resistor.

Optionally, the above-identified nonlinearities caused by the ripple content can be reduced via a series LC shunting outer loop feedback resistor. FIG. 8 illustrates an example topology of a Class D amplifier 800 with a series LC shunting outer loop feedback resistor. For example, the Class D amplifier 800 can be identical or similar to the Class D amplifier 100 of FIG. 1, except that the Class D amplifier 800 does not include the notch filter 150 (e.g., the output of the outer loop is coupled to the input of the inner loop) and instead includes an extra inductor 802 and resistor 804.

The inductor 802 and the resistor 804 can be coupled in series, where one end of the resistor 804 is coupled to one end of the inductor 802 and the other end of the resistor 804 is coupled to ground. The other end of the inductor 802 can be coupled to a node shared by one end of the resistor 118 and one end of the resistor 120. Like the notch filter 150, the inductor 802 and the resistor 804 in the illustrated configuration can reduce the nonlinearities caused by the ripple content by further filtering the ripple content.

Example Process Flow

Figure 9:
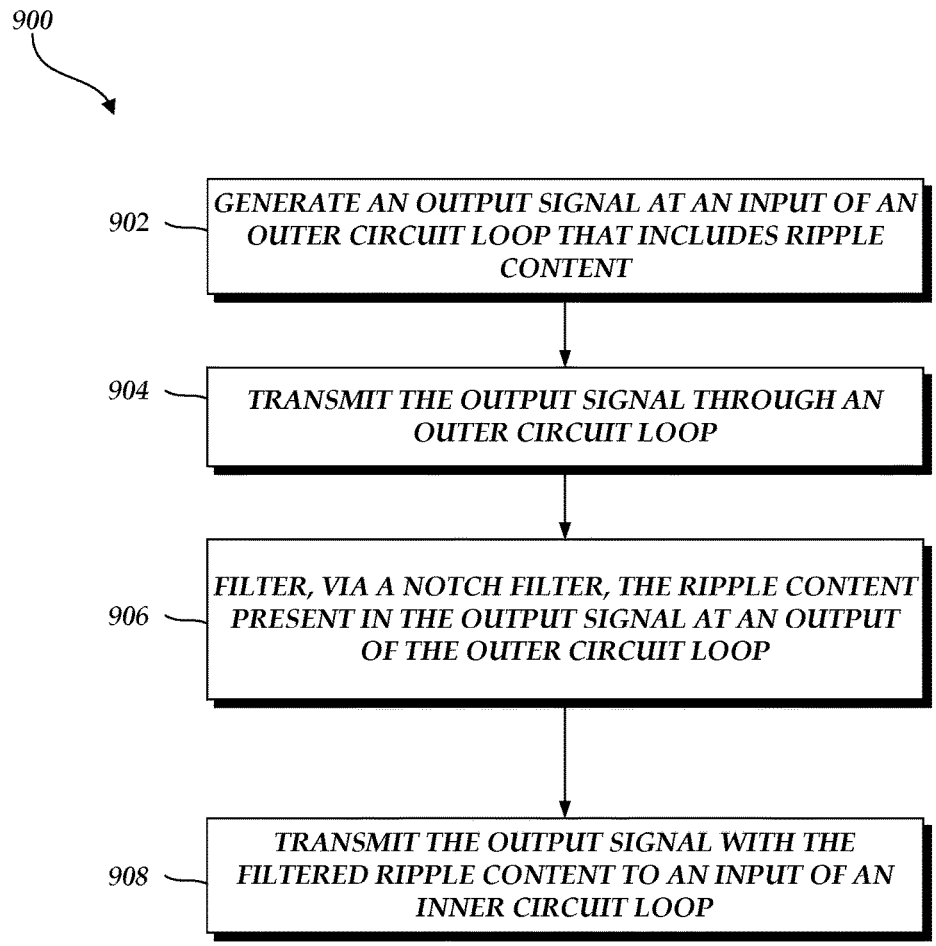
FIG. 9 is a flowchart depicting an illustrative example operation of reducing nonlinearities caused by ripple content.

FIG. 9 is a flowchart 900 depicting an illustrative example operation of reducing nonlinearities caused by ripple content. Depending on the embodiment, the method of FIG. 9 may include fewer and/or additional blocks and the blocks may be performed in an order different than illustrated. The process may optionally be implemented using one or more of the circuit topologies discussed herein.

In block 902, an output signal is generated that includes ripple content. For example, the output signal can be generated at the output of a filter circuit and the input of an outer circuit loop. The output signal may be the output signal of a Class D amplifier.

In block 904, the output signal is transmitted through the outer circuit loop. While the primary function of the outer circuit loop may be to reduce the impact of an LC filter circuit on the output voltage (e.g., the LC filter circuit may normally provide a variable frequency response, but the outer circuit loop can cause the frequency response to become more constant), the components of the outer circuit loop may be sized in a manner such that the outer circuit loop attenuates ripple content present in the output signal.

In block 906, the ripple content present in the output signal at an output of the outer circuit loop is filtered (e.g., via a notch filter). For example, the notch filter can be coupled to the output of the outer circuit loop and to an input of an inner circuit loop. Optionally, the notch filter is a noninverting active series LC notch filter, an inverting active series LC notch filter, a noninverting active parallel LC notch filter, an inverting active parallel LC notch filter, or a noninverting active twin tee filter.

In block 908, the output signal with the filtered ripple content is transmitted to an input of an inner circuit loop. In an embodiment, the output of the notch filter is coupled to the input of the inner circuit loop and the output of the inner circuit loop is coupled to the input of the filter circuit.

Terminology

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. An apparatus comprising:
an output;
an inner circuit loop that has an input and an output;
a filter circuit that has an input and an output, wherein the input of the filter circuit is coupled to the output of the inner circuit loop, and wherein the output of the filter circuit is coupled to the output of the apparatus;
an outer circuit loop that has an input and output, wherein the input of the outer circuit loop is coupled to the output of the filter circuit and the output of the apparatus; and
a notch filter that has an input and an output, wherein the notch filter comprises a noninverting active series LC notch filter comprising a resistor, an inductor, a capacitor, and a linear transfer function device, wherein a first end of the resistor is the input of the notch filter and is coupled to the output of the outer circuit loop, wherein a first end of the inductor is coupled in series with a first end of the capacitor, wherein a second end of the capacitor is coupled to ground, wherein a second end of the resistor and a second end of the inductor are coupled to a positive input of the linear transfer function device, wherein an output of the linear transfer function device is the output of the notch filter and is coupled to a negative input of the linear transfer function device and the input of the inner circuit loop, and wherein the notch filter is configured to reduce a portion of a ripple content originating at the output of the apparatus that is present at the input of the inner circuit loop from a first level to a second level lower than the first level.

2. The apparatus of claim 1, wherein the notch filter is configured to reduce the ripple content by 2% to 20%.

3. The apparatus of claim 1, wherein the apparatus comprises a Class D amplifier.

4. A method comprising:
generating an output signal at an output of a filter circuit and at an input of an outer circuit loop, wherein the output of the filter circuit is coupled to the input of the outer circuit loop, and wherein the output signal comprises a ripple content;
transmitting the output signal through the outer circuit loop;
filtering, via a notch filter, the ripple content present in the output signal at an output of the outer circuit loop, wherein the notch filter comprises an inverting active parallel LC notch filter comprising a first resistor, a second resistor, a third resistor, and a fourth resistor, an inductor, a capacitor, a first linear transfer function device, and a second linear transfer function device, wherein a first end of the inductor and a first end of the capacitor are coupled to the output of the outer circuit loop, wherein a second end of the inductor and a second end of the capacitor are coupled to a first end of the first resistor, wherein a second end of the first resistor is coupled to a negative input of the first linear transfer function device and a first end of the second resistor, wherein a positive input of the first linear transfer function device is coupled to ground, wherein an output of the first linear transfer function device is coupled to a second end of the second resistor and a first end of the third resistor, wherein a second end of the third resistor is coupled to a negative input of the second linear transfer function device and a first end of the fourth resistor, wherein a positive input of the second linear transfer function device is coupled to ground, and wherein an output of the second linear transfer function device is coupled to a second end of the fourth resistor and an input of an inner circuit loop; and
receiving the output signal with the filtered ripple content at the input of the an inner circuit loop, wherein an output of the inner circuit loop is coupled to an input of the filter circuit.

5. The method of claim 4, wherein filtering, via the notch filter, the ripple content present in the output signal, further comprises reducing the ripple content by 2% to 20%.

6. The method of claim 4, wherein the output voltage comprises an output voltage of a Class D amplifier.

7. A method comprising:
generating an output signal at an output of a filter circuit and at an input of an outer circuit loop, wherein the output of the filter circuit is coupled to the input of the outer circuit loop, and wherein the output signal comprises a ripple content;
transmitting the output signal through the outer circuit loop;
filtering, via a notch filter, the ripple content present in the output signal at an output of the outer circuit loop, wherein the notch filter comprises a noninverting active twin tee filter comprising a first resistor, a second resistor, a third resistor, a fourth resistor, and a fifth resistor, a first capacitor, a second capacitor, a third capacitor, a first linear transfer function device, and a second linear transfer function device, wherein a first end of the first resistor and a first end of the first capacitor are coupled to the output of the outer circuit loop, wherein a second end of the first capacitor is coupled to a first end of the third resistor and a first end of the second capacitor, wherein a second end of the first resistor is coupled to a first end of the second resistor and a first end of the third capacitor, wherein a second end of the third resistor and a second end of the third capacitor are coupled to an output of the second linear transfer function device, wherein a second end of the second resistor and a second end of the second capacitor are coupled to a positive input of the first linear transfer function device, wherein an output of the first linear transfer function device is coupled to a negative input of the first linear transfer function device, an input of an inner circuit loop, and a first end of the fourth resistor, wherein a second end of the fourth resistor is coupled to a first end of the fifth resistor and a positive input of the second linear transfer function device, wherein a second end of the fifth resistor is coupled to ground, and wherein the output of the second linear transfer function device is coupled to a negative input of the second linear transfer function device; and
receiving the output signal with the filtered ripple content at the input of the an inner circuit loop, wherein an output of the inner circuit loop is coupled to an input of the filter circuit.

8. The method of claim 7, wherein filtering, via the notch filter, the ripple content present in the output signal, further comprises reducing the ripple content by 2% to 20%.

9. The method of claim 7, wherein the output voltage comprises an output voltage of a Class D amplifier.

10. An apparatus comprising:
an output;
an inner circuit loop that has an input and an output;
a filter circuit that has an input and an output, wherein the input of the filter circuit is coupled to the output of the inner circuit loop, and wherein the output of the filter circuit is coupled to the output of the apparatus;
an outer circuit loop that has an input and output, wherein the input of the outer circuit loop is coupled to the output of the filter circuit and the output of the apparatus; and
a notch filter that has an input and an output, wherein the notch filter comprises an inverting active series LC notch filter comprising a first resistor, a second resistor, a third resistor, a fourth resistor, a fifth resistor, an inductor, a capacitor, a first linear transfer function device, and a second linear transfer function device, wherein a first end of the first resistor is the input of the notch filter and is coupled to the output of the outer circuit loop, wherein a second end of the first resistor is coupled to a first end of the second resistor and a first end of the inductor, wherein a second end of the inductor is coupled to a first end of the capacitor, wherein a second end of the capacitor is coupled to ground, wherein a second end of the second resistor is coupled to a negative input of the first linear transfer function device and a first end of the third resistor, wherein a positive input of the first linear transfer function device is coupled to ground, wherein an output of the first linear transfer function device is coupled to a second end of the third resistor and a first end of the fourth resistor, wherein a second end of the fourth resistor is coupled to a negative input of the second linear transfer function device and a first end of the fifth resistor, wherein a positive input of the second linear transfer function device is coupled to ground, wherein an output of the second linear transfer function device is the output of the notch filter and is coupled to a second end of the fifth resistor and the input of the inner circuit loop, and wherein the notch filter is configured to reduce a portion of a ripple content originating at the output of the apparatus that is present at the input of the inner circuit loop from a first level to a second level lower than the first level.

11. The apparatus of claim 10, wherein the notch filter is configured to reduce the ripple content by 2% to 20%.

12. The apparatus of claim 10, wherein the apparatus comprises a Class D amplifier.

13. An apparatus comprising:
an output;
an inner circuit loop that has an input and an output;
a filter circuit that has an input and an output, wherein the input of the filter circuit is coupled to the output of the inner circuit loop, and wherein the output of the filter circuit is coupled to the output of the apparatus;
an outer circuit loop that has an input and output, wherein the input of the outer circuit loop is coupled to the output of the filter circuit and the output of the apparatus; and
a notch filter that has an input and an output, wherein the notch filter comprises a noninverting active parallel LC notch filter comprising a resistor, an inductor, a capacitor, and a linear transfer function device, wherein a first end of the inductor and a first end of the capacitor are the input of the notch filter and are coupled to the output of the outer circuit loop, wherein a second end of the inductor and a second end of the capacitor are coupled to a first end of the resistor and a positive input of the linear transfer function device, wherein a second end of the resistor is coupled to ground, wherein an output of the linear transfer function device is the output of the notch filter and is coupled to a negative input of the linear transfer function device and the input of the inner circuit loop, and wherein the notch filter is configured to reduce a portion of a ripple content originating at the output of the apparatus that is present at the input of the inner circuit loop from a first level to a second level lower than the first level.

14. The apparatus of claim 13, wherein the notch filter is configured to reduce the ripple content by 2% to 20%.

15. The apparatus of claim 13, wherein the apparatus comprises a Class D amplifier.

* * * * *